(12) United States Patent
Yen et al.

(10) Patent No.: US 11,545,493 B2
(45) Date of Patent: Jan. 3, 2023

(54) MEMORY DEVICES AND METHODS OF FABRICATING THE SAME

(71) Applicant: Winbond Electronics Corp., Taichung (TW)

(72) Inventors: Ying-Chu Yen, Taichung (TW); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 48 days.

(21) Appl. No.: 17/130,883

(22) Filed: Dec. 22, 2020

(65) Prior Publication Data

US 2021/0111177 A1 Apr. 15, 2021

Related U.S. Application Data

(62) Division of application No. 16/411,584, filed on May 14, 2019, now Pat. No. 10,910,384.

(30) Foreign Application Priority Data

May 14, 2018 (TW) .................................. 107116279

(51) Int. Cl.
*H01L 27/108* (2006.01)
*H01L 21/311* (2006.01)
(Continued)

(52) U.S. Cl.
CPC .... *H01L 27/10855* (2013.01); *H01L 21/0217* (2013.01); *H01L 21/02164* (2013.01); *H01L 21/26513* (2013.01); *H01L 21/308* (2013.01); *H01L 21/30604* (2013.01); *H01L 21/31111* (2013.01); *H01L 21/76224* (2013.01); *H01L 21/76802* (2013.01); *H01L 21/76837* (2013.01); *H01L 21/76877* (2013.01);
(Continued)

(58) Field of Classification Search
CPC ........... H01L 21/02164; H01L 21/0217; H01L 21/26513; H01L 21/30604; H01L 21/31111; H01L 21/76224; H01L 21/76802; H01L 21/76877; H01L 21/31053; H01L 27/10855; H01L 27/10814; H01L 27/10823; H01L 27/10876; H01L 27/10885; H01L 27/10891
See application file for complete search history.

(56) References Cited

U.S. PATENT DOCUMENTS

| 2010/0237397 A1 | 9/2010 | Uchiyama |
| 2011/0037111 A1 | 2/2011 | Kim et al. |
| 2012/0074518 A1 | 3/2012 | Kim et al. |

FOREIGN PATENT DOCUMENTS

CN 106876319 A 6/2017

*Primary Examiner* — Matthew L Reames
(74) *Attorney, Agent, or Firm* — Muncy, Geissler, Olds & Lowe, P.C.

(57) ABSTRACT

A method of fabricating a memory device includes forming an oxide layer on a semiconductor substrate, and forming an isolation structure in the semiconductor substrate and the oxide layer to define an active area. The method also includes forming a word line and a bit line in the semiconductor substrate, wherein the bit line is above the word line. The method further includes removing the oxide layer to form a recess between the isolation structure and the bit line, and forming a storage node contact in the recess. In addition, from a top view, the storage node contact of the memory device overlaps a corresponding portion of the active area.

8 Claims, 17 Drawing Sheets

(51) Int. Cl.
*H01L 21/02* (2006.01)
*H01L 21/768* (2006.01)
*H01L 21/306* (2006.01)
*H01L 21/308* (2006.01)
*H01L 21/265* (2006.01)
*H01L 21/762* (2006.01)
H01L 21/3105 (2006.01)

(52) U.S. Cl.
CPC .. *H01L 27/10814* (2013.01); *H01L 27/10823* (2013.01); *H01L 27/10876* (2013.01); *H01L 27/10885* (2013.01); *H01L 27/10891* (2013.01); *H01L 21/02271* (2013.01); *H01L 21/31053* (2013.01)

MEMORY DEVICES AND METHODS OF FABRICATING THE SAME

CROSS REFERENCE TO RELATED APPLICATIONS

This application is a Divisional of U.S. patent application Ser. No. 16/411,584, filed May 14, 2019, which claims priority of Taiwan Patent Application No. 107116279, filed on May 14, 2018, the entirety of which is incorporated by reference herein.

BACKGROUND

Field

The disclosure relates to semiconductor device fabrication technology, and more particularly, to memory devices and methods of fabricating the same.

Description of the Related Art

Dynamic random access memory (DRAM) is a semiconductor device that is popular for use in various electronic applications. DRAM usually has a plurality of unit cells, and each of the unit cells includes a transistor and a capacitor. The capacitor can temporarily store data such as electronic information, and the transistor acts as a switch for controlling the reading and writing of data. A source electrode of the transistor is connected to a bit line, and a gate electrode of the transistor is connected to a word line. The transistor responds to a control signal from the word line and transfers data between the bit line and the capacitor.

Recently, in order to increase the operation speed of semiconductor devices and meet the requirement of miniaturization of these semiconductor devices, there has been a need to increase the integration density of DRAM. However, with the increase of the integration density of DRAM, the process of fabricating the DRAM becomes more complex, and therefore more difficult. Therefore, for continuously reducing the scale of memory devices, there are still many challenges in the fabrication of the memory devices.

BRIEF SUMMARY

As new methods are continuously sought to reduce the scale of memory devices, overlapping between a storage node contact and an active area becomes a challenge. According to embodiments of the disclosure, methods of fabricating memory devices are provided to promote the overlapping of the storage node contact with a corresponding portion of the active area. As a result, the storage node contact is entirely located in the area of the corresponding portion of the active area. Moreover, there is no offset between the storage node contact and the corresponding portion of the active area. At the same time, there is no need to form an additional mask for the storage node contact in the fabrication of the memory device. Therefore, the steps of the process of fabricating the memory devices can be simplified.

In some embodiments, a method of fabricating a memory device is provided. The method includes forming an oxide layer on a semiconductor substrate. The method also includes forming an isolation structure in the semiconductor substrate and the oxide layer, wherein the isolation structure defines an active area. The method further includes forming a word line and a bit line in the semiconductor substrate, wherein the bit line is above the word line. In addition, the method includes removing a portion of the oxide layer to form a recess between the isolation structure and the bit line, and forming a storage node contact in the recess.

In some embodiments, a memory device is provided. The memory device includes a semiconductor substrate having an isolation structure disposed therein and to define an active area. The memory device also includes a word line and a bit line disposed in the semiconductor substrate, wherein the bit line is above the word line. The memory device further includes a storage node contact disposed between the isolation structure and the bit line, wherein from a top view, the storage node contact overlaps a corresponding portion of the active area.

A detailed description is given in the following embodiments with reference to the accompanying drawings.

BRIEF DESCRIPTION OF DRAWINGS

The embodiments of the disclosure can be more fully understood by reading the subsequent detailed description and examples with references made to the accompanying drawings. For clarity of illustration, various elements in the drawings may not be drawn to scale, wherein:

FIGS. 2A to 2D, 3A to 3C, 4A to 4O and 5A to 5E show schematic cross sections of various intermediate stages of a method of fabricating a memory device according to some embodiments, wherein

DETAILED DESCRIPTION

Figure 1:
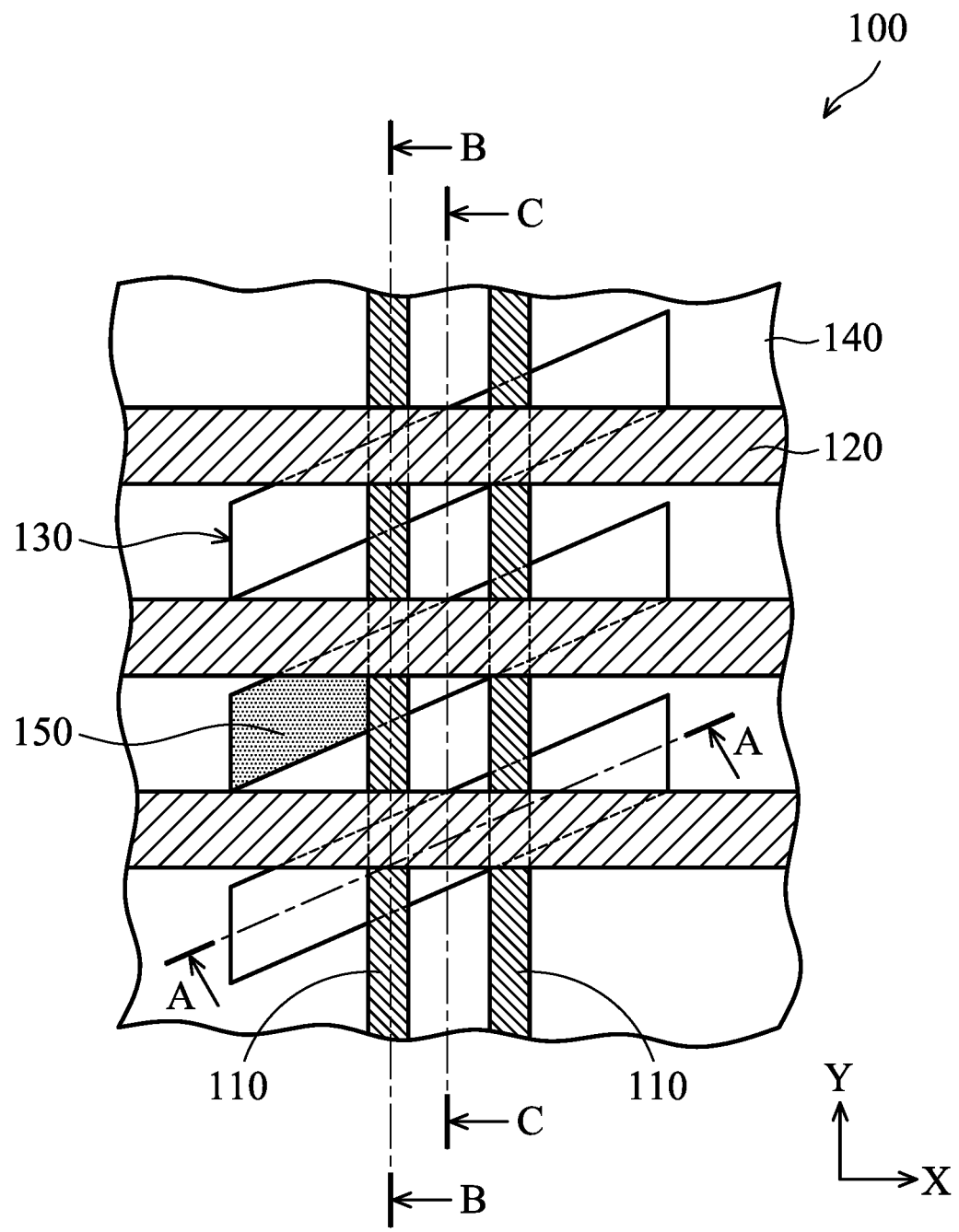
FIG. 1 shows a top view of a portion of a memory device according to some embodiments.

The following description is the contemplated mode of carrying out some embodiments of the disclosure. The following disclosure provides many different embodiments for implementing different features of the disclosure. Various components and arrangements in the embodiments are made for the purpose of illustrating the general principles of some embodiments of the disclosure and should not be taken in a limiting sense. In addition, the present disclosure may repeat reference numerals and/or letters in the figures of the embodiments. This repetition is for the purpose of simplicity and clarity and does not in itself dictate a relationship between the various embodiments.

Referring to FIG. 1, a top view of a portion of a memory device 100 according to some embodiments of the disclosure is shown. For clarity of illustration, FIG. 1 shows some features of the memory device 100. As shown in FIG. 1, the memory device 100 includes an isolation structure 140 that defines an active area 130 surrounded by the isolation structure 140. In some embodiments, the planar layout of the active area 130 is a slant strip-shaped region relative to an X-axis and a Y-axis shown in FIG. 1. In addition, the memory device 100 includes a plurality of word lines 110 extending along the direction of the Y-axis, and a plurality of bit lines 120 extending along the direction of the X-axis.

In some embodiments, each of the active areas 130 of the memory device 100 has two word lines 110 and one bit line 120 across the region of the active areas 130. The word line 110 and the bit line 120 are disposed to cross with each other. Moreover, the memory device 100 includes a storage node contact 150. According to embodiments of the disclosure, from a top view, the storage node contact 150 overlaps a corresponding portion of the active area 130. The overlap between the storage node contact 150 and the corresponding portion of the active area 130 may be a partial overlap or a complete overlap. In some embodiments, when the storage node contact 150 partially overlaps a corresponding portion of the active area 130, the area of the storage node contact 150 is smaller than the area of the corresponding portion of the active area 130. When the storage node contact 150 completely overlaps a corresponding portion of the active area 130, the area of the storage node contact 150 is equal to the area of the corresponding portion of the active area 130. According to embodiments of the disclosure, both the partial overlap and the complete overlap between the storage node contact 150 and the corresponding portion of the active area 130 can make the storage node contact 150 to be completely located in the area of the active area 130. As shown in FIG. 1, according to some embodiments of the disclosure, when the storage node contact 150 completely overlaps a corresponding portion of the active area 130, the boundary of the storage node contact 150 is aligned with the boundary of the corresponding portion of the active area 130. As a result, there is zero-shift (or zero-offset) in the overlap between the storage node contact 150 and the corresponding portion of the active area 130.

Figure 2A:
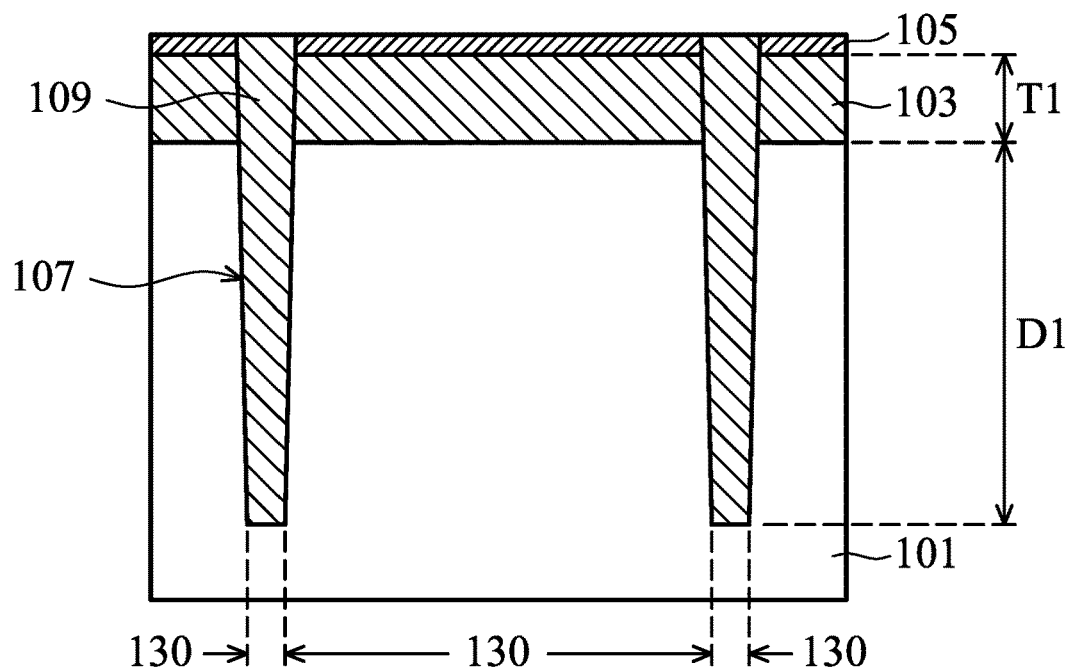

Referring to FIGS. 2A to 2D, cross sections of various intermediate stages of a method of fabricating the memory device 100 according to some embodiments are shown. FIGS. 2A to 2D are taken along line A-A of FIG. 1. As shown in FIG. 2A, a semiconductor substrate 101, for example a silicon wafer, is provided. An oxide layer 103 and a pad nitride layer 105 are formed on the semiconductor substrate 101 in sequence. The material of the oxide layer 103 is for example silicon dioxide. The material of the pad nitride layer 105 is for example silicon nitride. The pad nitride layer 105 may be formed by chemical vapor deposition (CVD) process. The oxide layer 103 may be formed from a pad oxide layer and a tetraethoxysilane (TEOS) oxide layer. In some examples, the thickness T1 of the oxide layer 103 is about 50 nm.

Next, an isolation trench 107 is formed in the semiconductor substrate 101, the oxide layer 103 and the pad nitride layer 105 using an etching process. Before the etching process, in some examples, a patterned photoresist is formed on the pad nitride layer 105 to be used as an etching mask. The patterned photoresist may be formed by photoresist coating, exposure and development processes. In other examples, a hard mask is used as an etching mask and formed on the pad nitride layer 105. The etching mask has an opening that corresponds to the location of the isolation trench 107. In some examples, the isolation trench 107 has a depth D1 of about 350 nm in the semiconductor substrate 101.

Thereafter, the isolation trench 107 is filled with a first dielectric material 109. The first dielectric material 109 is also deposited on the pad nitride layer 105. The first dielectric material 109 is for example silicon dioxide. Then, the portion of the first dielectric material 109 outside of the isolation trench 107 is removed by a chemical mechanical polishing (CMP) process. In the CMP process, the pad nitride layer 105 is used as a stop layer, such that the first dielectric material 109 within the isolation trench 107 has a top surface that is coplanar with the top surface of the pad nitride layer 105.

Figure 2B:
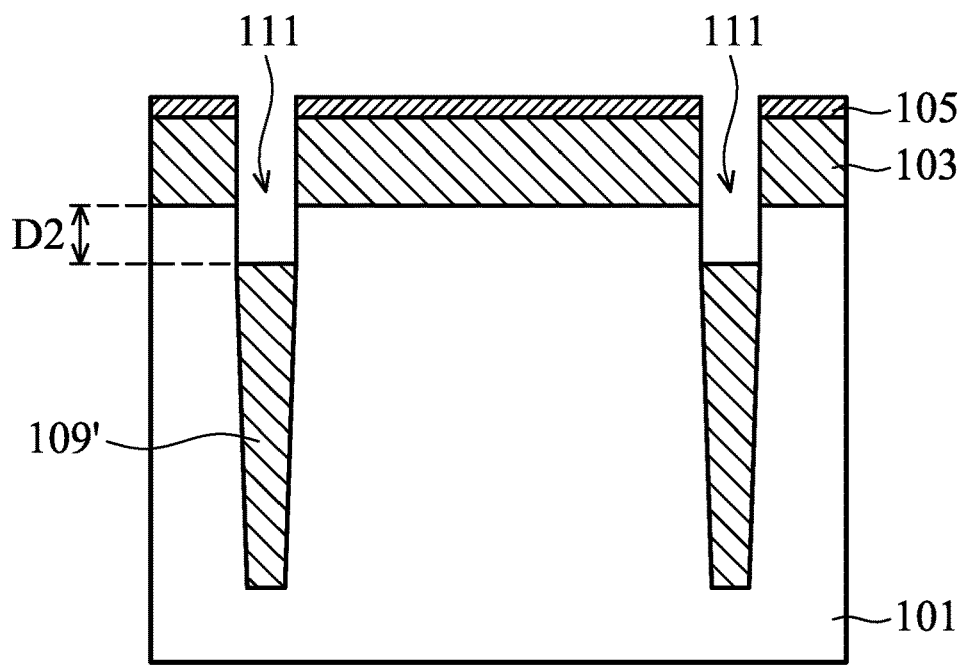

Referring to FIG. 2B, a recess 111 is formed in the first dielectric material 109 within the isolation trench 107 using an etching process. Therefore, a first dielectric portion 109' is obtained in the lower portion of the isolation trench 107. In some examples, the bottom surface of the recess 111 is lower than the top surface of the semiconductor substrate 101 by a depth D2 of about 30 nm.

Figure 2C:
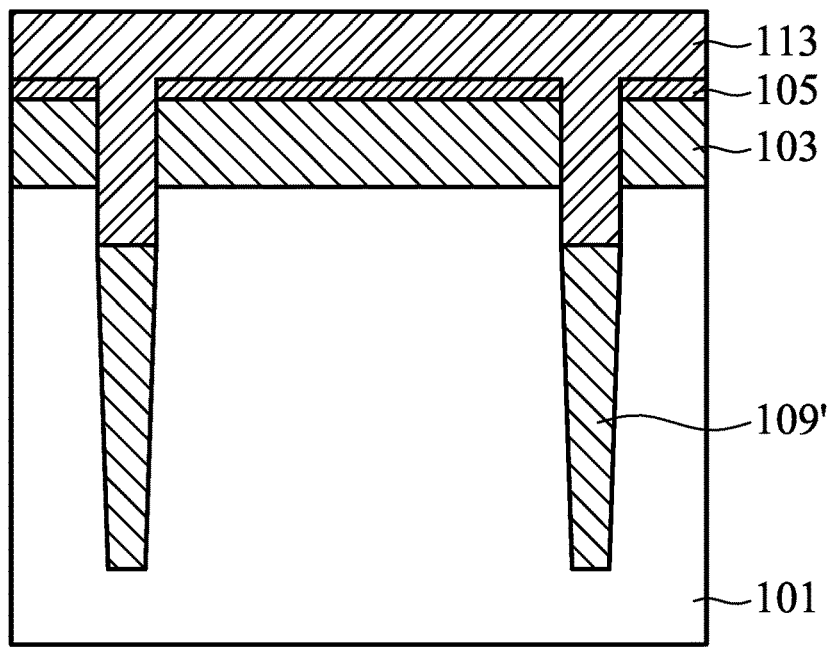
Figure 2D:
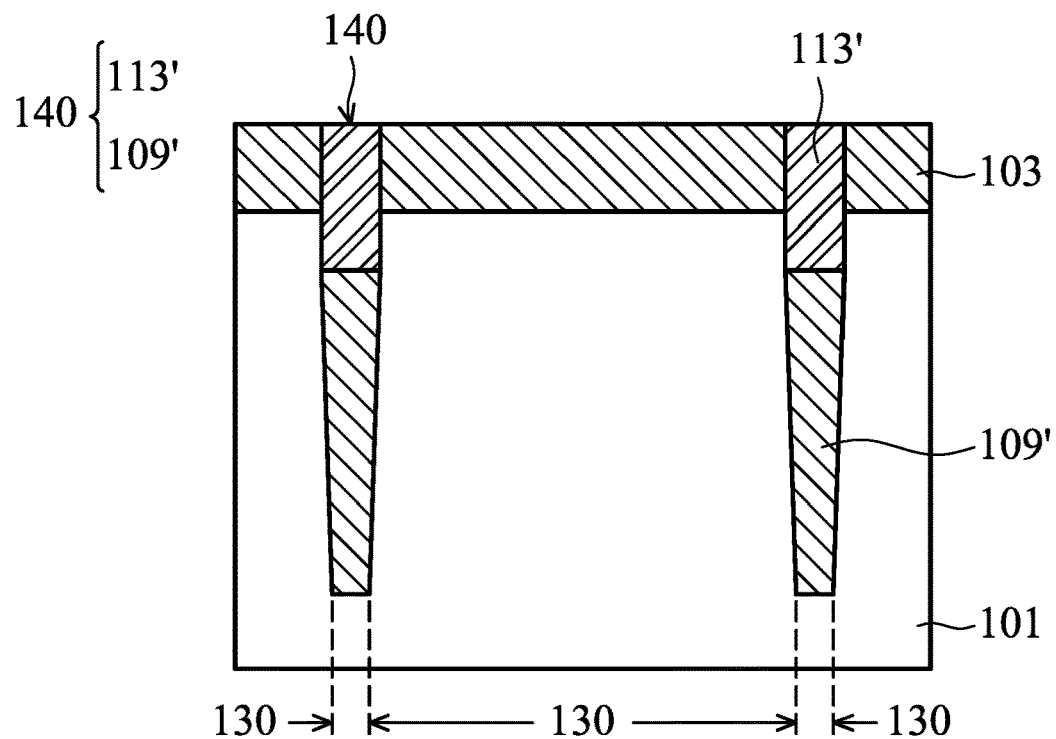

Referring to FIG. 2C, the recess 111 is filled with a second dielectric material 113. The second dielectric material 113 is also deposited on the pad nitride layer 105. The second dielectric material 113 is for example silicon nitride. Referring to FIG. 2D, an etch back process is performed on the second dielectric material 113 and the pad nitride layer 105 to remove a portion of the second dielectric material 113 and the pad nitride layer 105. As a result, a second dielectric portion 113' is obtained in the upper portion of the isolation trench 107. The first dielectric portion 109' and the second dielectric portion 113' in the isolation trench 107 are combined to form an isolation structure 140. The isolation structure 140 is also referred to as a shallow trench isolation (STI) structure. The isolation structure 140 defines the active area 130 of the memory device 100. At this fabrication stage, the top surface of the isolation structure 140 is coplanar with the top surface of the oxide layer 103.

Figure 3A:
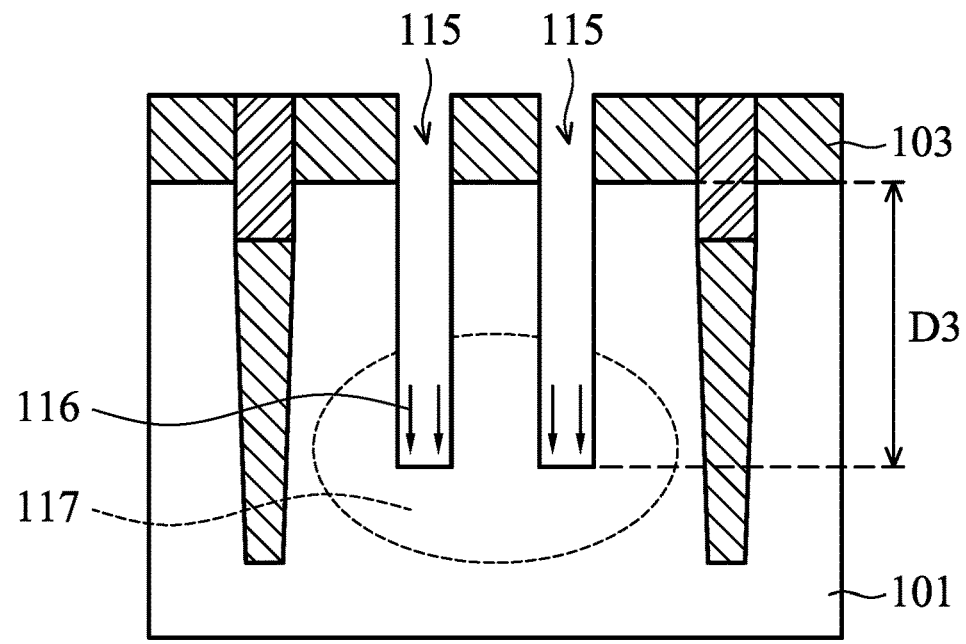
Figure 3B:
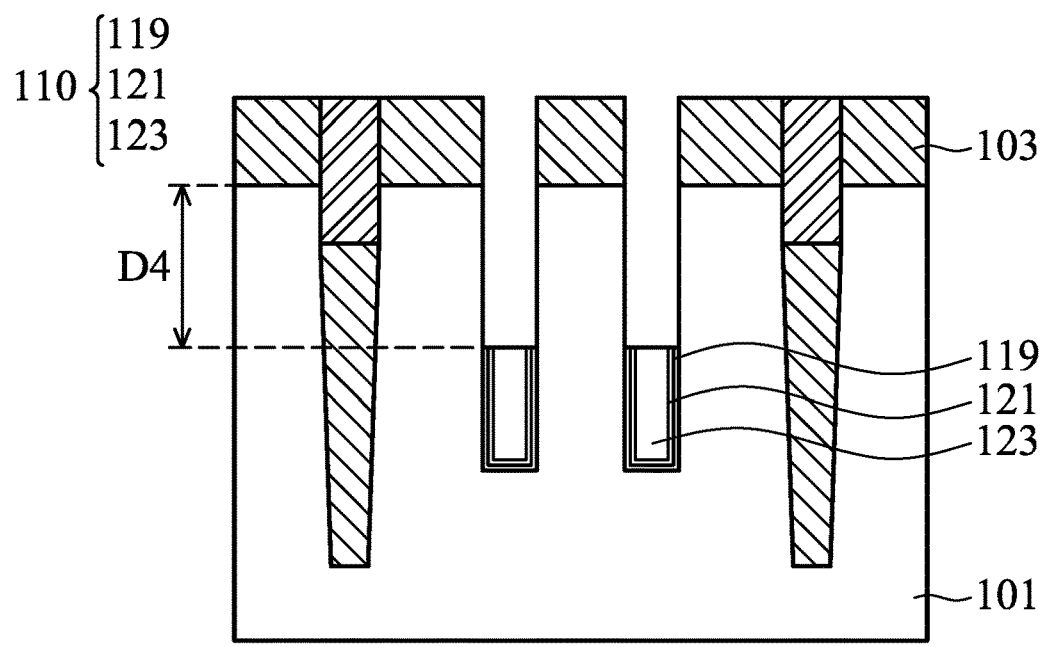
Figure 3C:
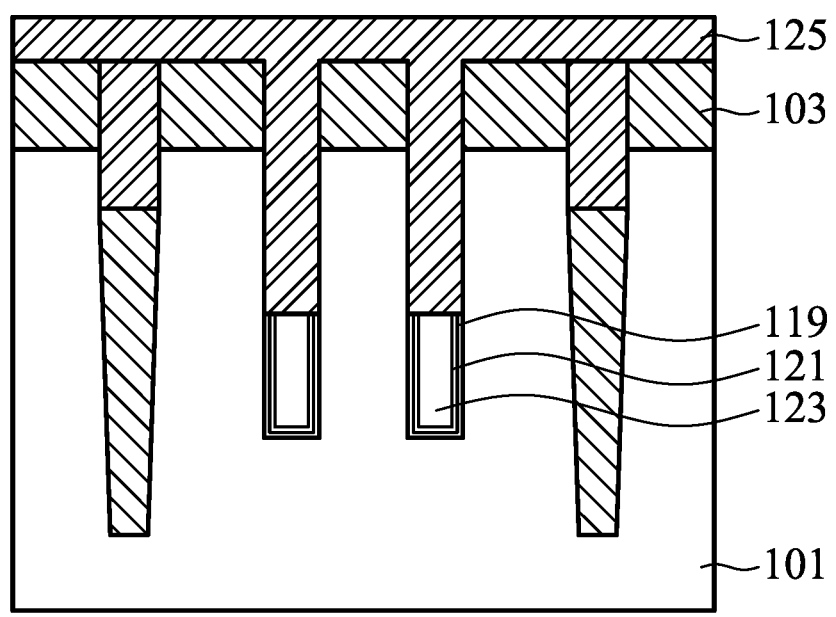

Following FIG. 2D, referring to FIGS. 3A to 3C, cross sections of various intermediate stages of the method of fabricating the memory device 100 according to some embodiments are shown. FIGS. 3A to 3C are taken along line A-A of FIG. 1. As shown in FIG. 3A, a word line trench 115 is formed in the in the semiconductor substrate 101 and the oxide layer 103 using an etching process. Before the etching process, in some examples, a patterned photoresist is formed on the oxide layer 103 to be used as an etching mask. The patterned photoresist may be formed by photoresist coating, exposure and development processes. In other examples, a hard mask is used as an etching mask and formed on the oxide layer 103. The etching mask has an opening that corresponds to the location of the word line trench 115. In some examples, the word line trench 115 has a depth D3 of about 210 nm in the semiconductor substrate 101. Next, an ion implantation process 116 is performed on the semiconductor substrate 101 through the word line trench 115. As a result, a well region and a channel region 117 are formed in the semiconductor substrate 101 around the bottom of the word line trench 115.

Referring to FIG. 3B, a gate dielectric layer 119, a barrier layer 121 and a word line conductive layer 123 are deposited in the word line trench 115 in sequence. Moreover, although not shown in FIG. 3B, the gate dielectric layer 119, the barrier layer 121 and the word line conductive layer 123 are also deposited on the oxide layer 103. The word line conductive layer 123 can also be used as a gate electrode layer. In some embodiments, the material of the gate dielectric layer 119 is for example silicon dioxide. The material of the barrier layer 121 is for example titanium nitride (TiN). The material of the word line conductive layer 123 is for example tungsten (W). Thereafter, an etch-back process is performed on the deposited materials of the gate dielectric layer 119, the barrier layer 121 and the word line conductive layer 123. As a result, a buried word line 110 is formed in the word line trench 115. In some examples, the top surface of the buried word line 110 is lower than the top surface of the semiconductor substrate 101 by a depth D4 of about 130 nm.

Referring to FIGS. 3B to 3C, the remaining portion of the word line trench 115 is filled with a dielectric material 125. The dielectric material 125 is also deposited on the oxide layer 103. In some embodiments, the dielectric material 125 is for example silicon nitride.

Figure 4A:
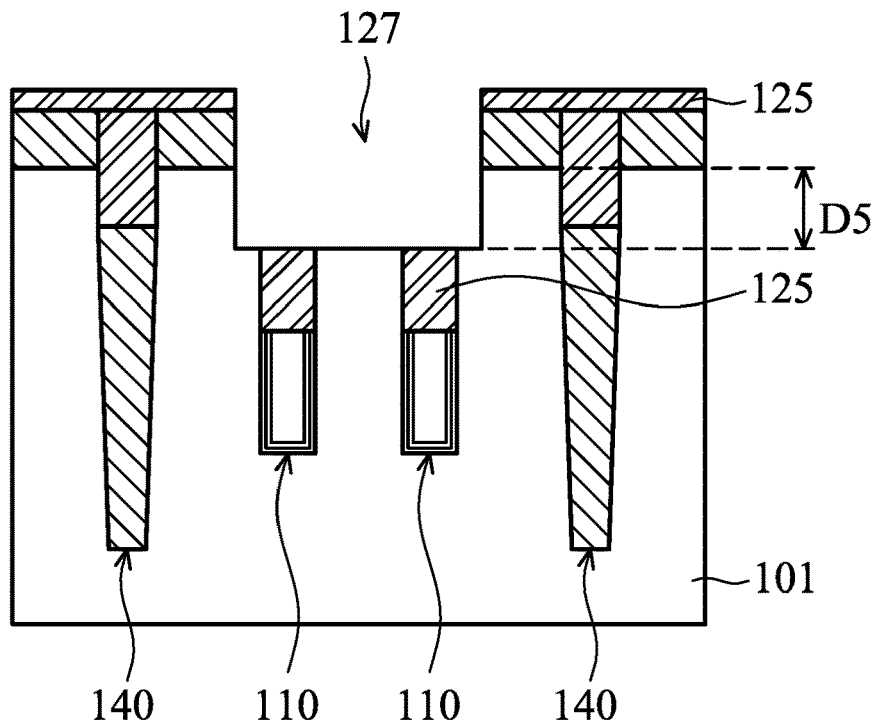

Following FIG. 3C, referring to FIG. 4A, a bit line trench 127 is formed in the semiconductor substrate 101, the oxide layer 103 and the dielectric material 125 using an etching process. The bottom surface of the bit line trench 127 is higher than the top surface of the word line 110. Moreover, after the bit line trench 127 is formed, a portion of the dielectric material 125 remains in the word line trench 115 to cover the word line 110.

Figure 4B:
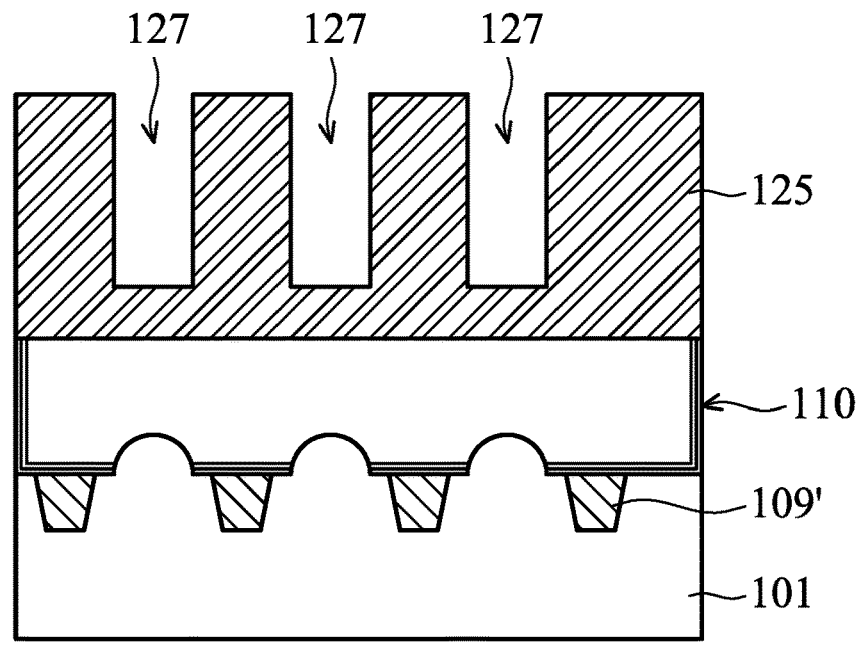
FIGS. 4B, 4F and 4N are taken along line B-B of FIG. 1, FIGS. 4C, 4G and 4O are taken along line C-C of FIG. 1, and the other figures are taken along line A-A of FIG. 1.
Figure 4C:
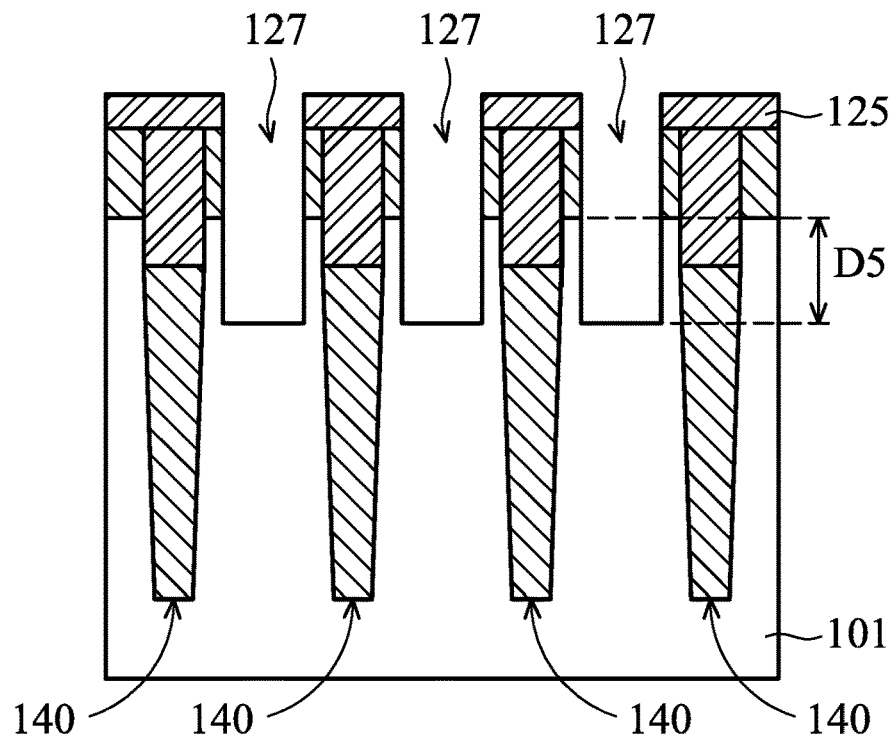

In some embodiments, the bottom surface of the bit line trench 127 is lower than the top surface of the semiconductor substrate 101 by a depth D5 of about 60 nm. At the same time, referring to FIGS. 4B and 4C, in which FIG. 4B shows a cross section of the bit line trench 127 located directly above the word line 110, and FIG. 4C shows a cross section of the bit line trench 127 located between two adjacent word lines 110. As shown in FIG. 4B, along line B-B of FIG. 1, the bit line trench 127 is formed in the dielectric material 125 that is directly above the word line 110. As shown in FIG. 4C, along line C-C of FIG. 1, the bit line trench 127 passes through the dielectric material 125 and is further formed in the semiconductor substrate 101 and the oxide layer 103. The location of the bit line trench 127 corresponds to the active area 130 between the isolation structures 140.

Figure 4D:
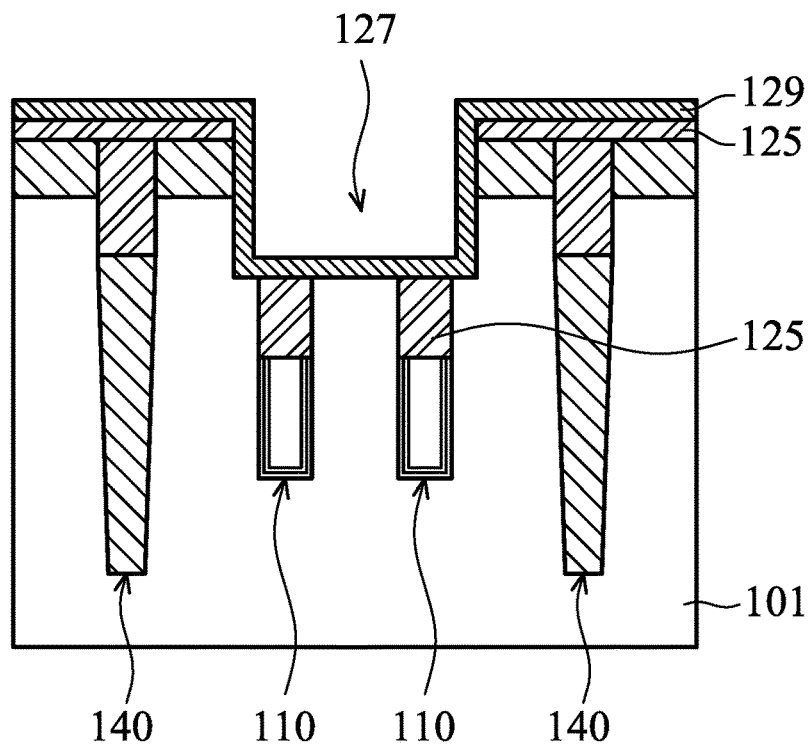

Following FIG. 4A, referring to FIG. 4D, a spacer layer 129 is conformally deposited on the sidewalls and the bottom surface of the bit line trench 127. The spacer layer 129 is also deposited on the dielectric material 125. In some embodiments, the material of the spacer layer 129 is for example silicon nitride, and the spacer layer 129 may be deposited by a CVD process. In addition, although not shown in figures, the spacer layer 129 is also conformally deposited on the sidewalls and the bottom surface of the bit line trench 127 of FIGS. 4B and 4C. Moreover, the spacer layer 129 is also deposited on the dielectric material 125 of FIGS. 4B and 4C.

Figure 4E:
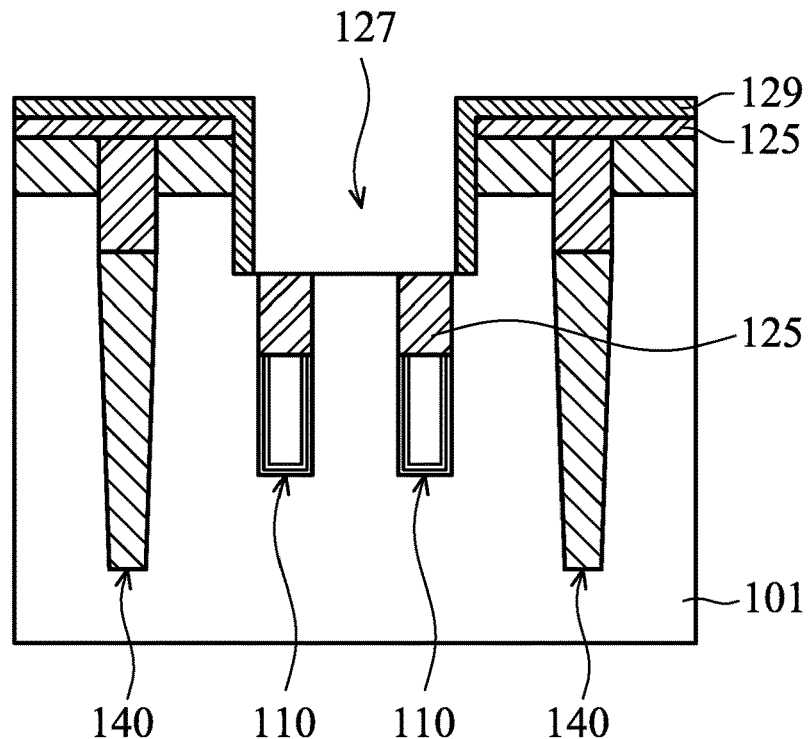

Referring to FIG. 4E, a portion of the spacer layer 129 on the bottom surface of the bit line trench 127 is removed by an etching process for forming a bit line contact. Before the etching process, in some examples, a patterned photoresist is formed on the spacer layer 129 to be used as an etching mask. The patterned photoresist may be formed by photoresist coating, exposure and development processes. At the same time, referring to FIG. 1, from a top view, an opening of the etching mask exposes a line-shaped region between two adjacent word lines 110. In some embodiments, the opening of the etching mask may also expose the two adjacent word lines 110.

Figure 4F:
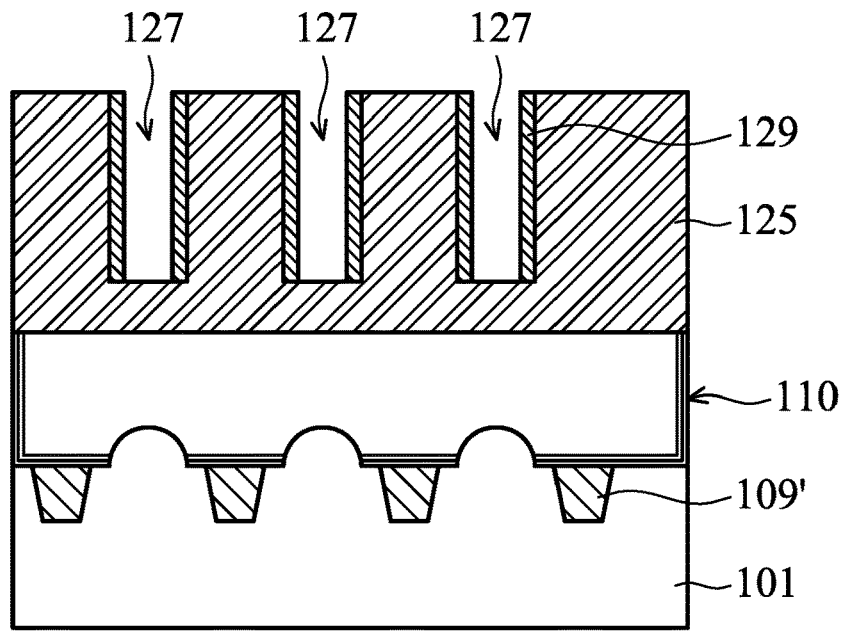
Figure 4G:
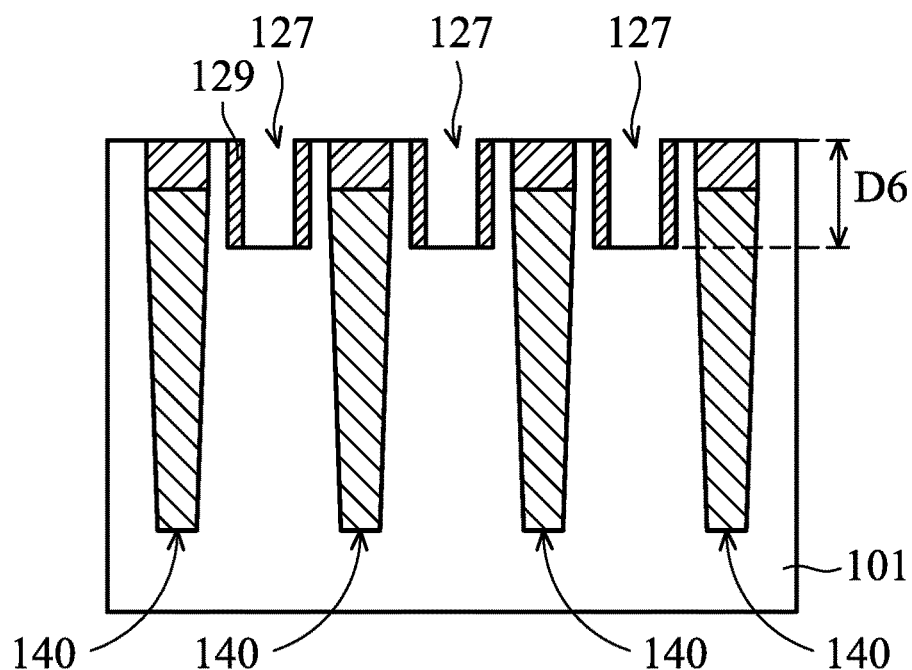

At the same time, referring to FIGS. 4F and 4G, in which FIG. 4F shows a cross section of the etched spacer layer 129 located directly above the word line 110, and FIG. 4G shows a cross section of the etched spacer layer 129 located between two adjacent word lines 110. In some embodiments, as shown in FIG. 4F, along line B-B of FIG. 1, when the etching mask completely exposes the two word lines 110, a portion of the spacer layer 129 on the bottom surface of the bit line trench 127 that is directly above the word line 110 is etched. In some other embodiments, the etching mask may completely cover the two word lines 110, and thus a portion of the spacer layer 129 on the bottom surface of the bit line trench 127 that is directly above the word line 110 is not etched. Another portion of the spacer layer 129 on the dielectric material 125 is also etched and removed. As shown in FIG. 4G, along line C-C of FIG. 1, both a portion of the spacer layer 129 on the bottom surface of the bit line trench 127 and a portion of the spacer layer 129 on the dielectric material 125 are etched and removed. The remaining portion of the spacer layer 129 is on the sidewalls of the bit line trench 127. At the same time, as shown in FIG. 4G, along line C-C of FIG. 1, in some embodiments, the oxide layer 103 on the semiconductor substrate 101 is partially removed or completely removed. The bit line trench 127 in FIG. 4G at the location along line C-C of FIG. 1 has a depth D6 that may be slightly deepened. In some examples, the depth D6 is about 70 nm.

Figure 4H:
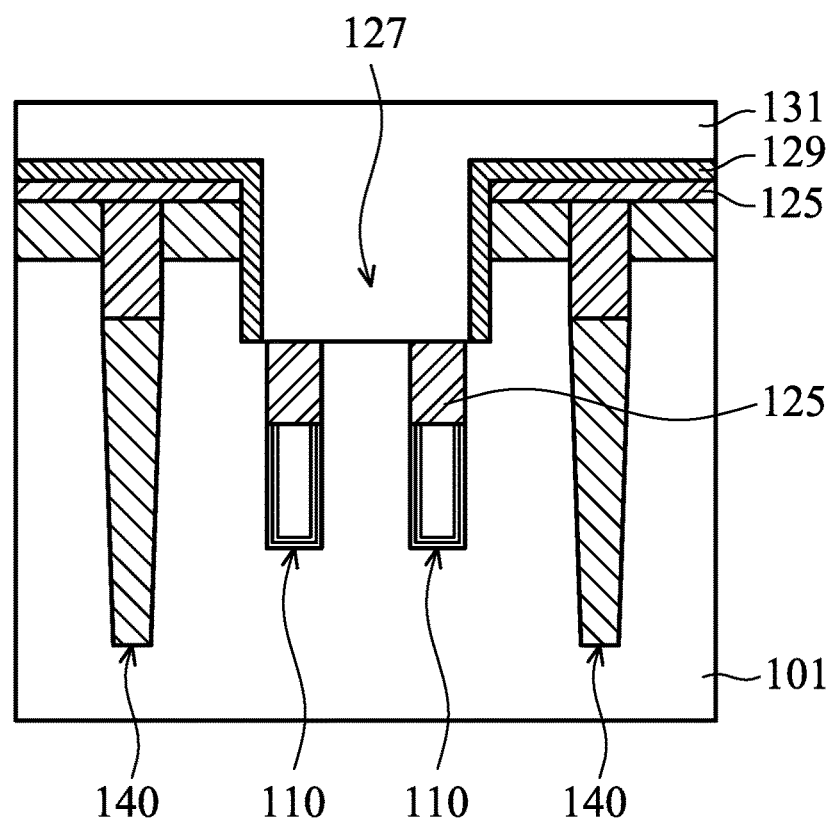

Following FIG. 4E, referring to FIG. 4H, a conductive material 131 is deposited in the bit line trench 127 for forming a bit line contact. The conductive material 131 is also deposited on the spacer layer 129 outside of the bit line trench 127. In some embodiments, the conductive material 131 is for example polysilicon. Although not shown, the conductive material 131 is also deposited in the bit line trench 127 of FIGS. 4F and 4G. In addition, the conductive material 131 is also deposited on the dielectric material 125 of FIG. 4F. Furthermore, the conductive material 131 is also deposited on the semiconductor substrate 101 and the isolation structure 140 of FIG. 4G.

Figure 4I:
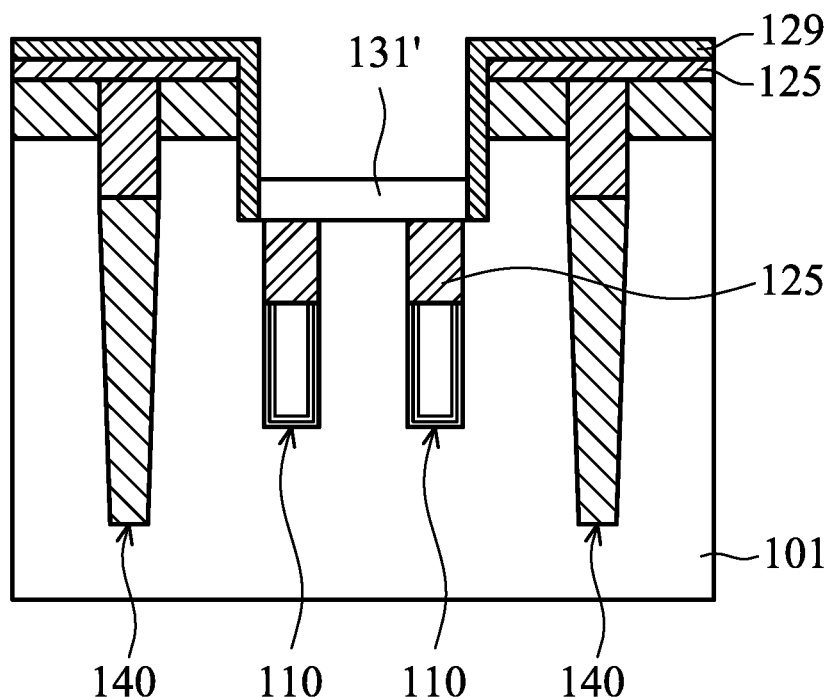

Referring to FIGS. 4H and 4I, an etch back process is performed on the conductive material 131 of FIG. 4H to form a bit line contact 131' on the bottom surface of the bit line trench 127 as shown in FIG. 4I. Although not shown, along line B-B and line C-C of FIG. 1, the conductive material 131 in the bit line trench 127 is also etched back.

Figure 4J:
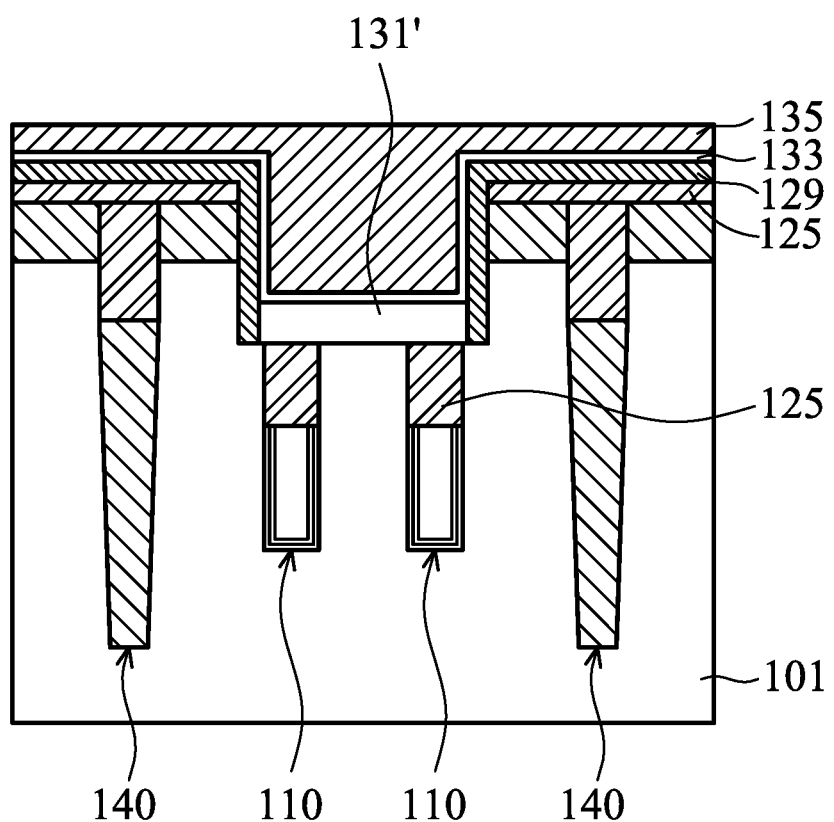

Referring to FIG. 4J, a barrier layer 133 and a bit line conductive layer 135 are deposited in the bit line trench 127 in sequence. The barrier layer 133 and the bit line conductive layer 135 are also deposited on the spacer layer 129 outside of the bit line trench 127. In some embodiments, the material of the barrier layer 133 is for example titanium nitride (TiN). The material of the bit line conductive layer 135 is for example tungsten (W). Although not shown, at the same time, along line B-B and line C-C of FIG. 1, the barrier layer 133 and the bit line conductive layer 135 are also deposited in the bit line trench 127 in sequence. In addition, the barrier layer 133 and the bit line conductive layer 135 are also deposited on the dielectric material 125 of FIG. 4F. Moreover, the barrier layer 133 and the bit line conductive layer 135 are also deposited on the semiconductor substrate 101 and the isolation structure 140 of FIG. 4G.

Figure 4K:
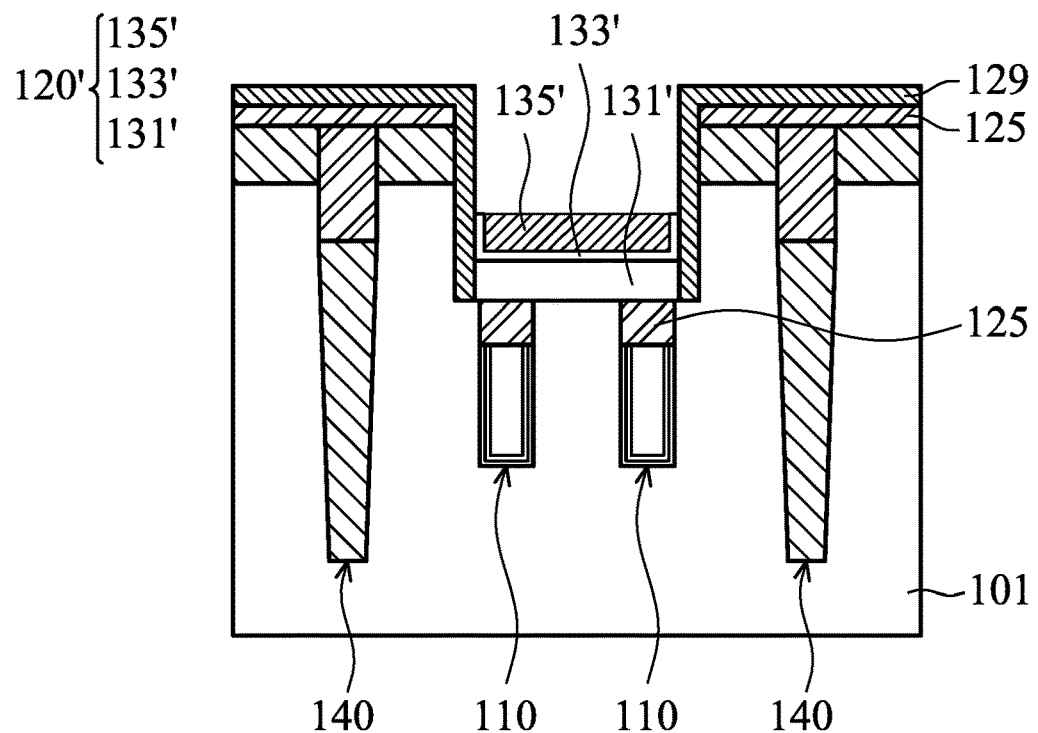

Referring to FIGS. 4J and 4K, an etch back process is performed on the barrier layer 133 and the bit line conductive layer 135 of 4J to form a conductive portion 120' of a buried bit line 1 120 as shown in FIG. 4K. The conductive portion 120' includes a bit line contact 131', a barrier layer 133' and a conductive layer 135'. In some embodiments, the top surface of the conductive portion 120' of the buried bit line 120 is lower than the top surface of the semiconductor substrate 101. In some other embodiments, the top surface of the conductive portion 120' of the buried bit line 120 may be higher than or level with the top surface of the semiconductor substrate 101. Although not shown, at the same time, along line B-B and line C-C of FIG. 1, the barrier layer 133 and the bit line conductive layer 135 in the bit line trench 127 are also etched back.

Figure 4L:
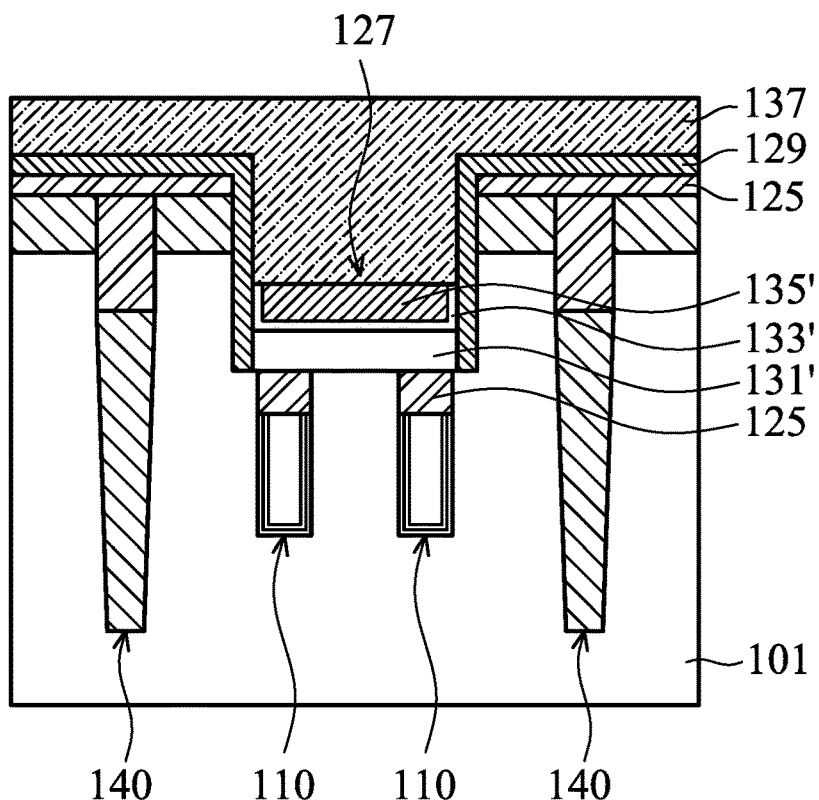

Referring to FIG. 4L, the remaining portion of the bit line trench 127 is filled with a dielectric material 137. Moreover, the dielectric material 137 is also deposited over the dielectric material 137 and the spacer layer 129 which are disposed above the oxide layer 103 and the isolation structure 140. In some embodiments, the dielectric material 137 is for example silicon nitride. Although not shown, at the same time, along line B-B and line C-C of FIG. 1, the remaining portion of the bit line trench 127 is also filled with the dielectric material 137. In addition, the dielectric material 137 is also deposited on the dielectric material 125 of FIG. 4F and on the semiconductor substrate 101 and the isolation structure 140 of FIG. 4G.

Figure 4M:
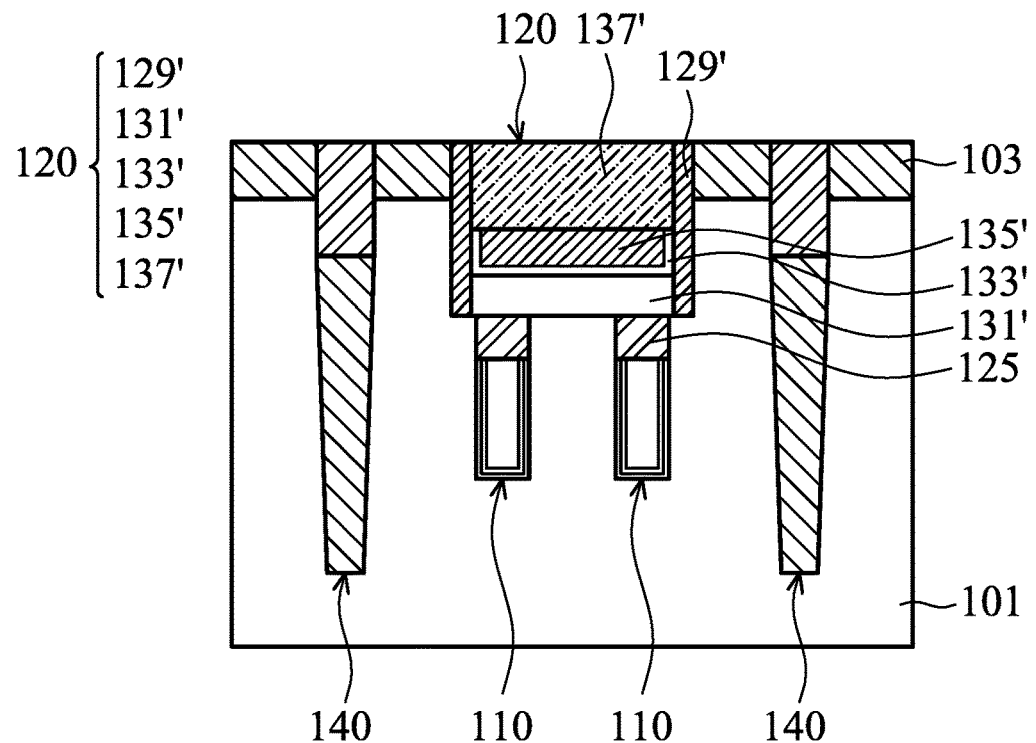

Referring to FIG. 4M, an etch-back process is performed on the dielectric material 137 which is disposed above the oxide layer 103 and the isolation structure 140. Also, the etch back process simultaneously removes the dielectric material 125 and the spacer layer 129 which are disposed above the oxide layer 103 and the isolation structure 140. As a result, a dielectric cap layer 137' is formed on the conductive layer 135' of the bit line 120. In addition, a spacer 129' is formed on the sidewalls of the bit line trench 127 to complete the bit line 120. In some embodiments, the bit line 120 includes the bit line contact 131', the barrier layer 133', the conductive layer 135', the dielectric cap layer 137' and the spacer 129'. As shown in FIG. 4M, in this fabrication stage, the top surface of the bit line 120, i.e. the upper surface of the dielectric cap layer 137', is coplanar with the top surface of the oxide layer 103.

Figure 4N:
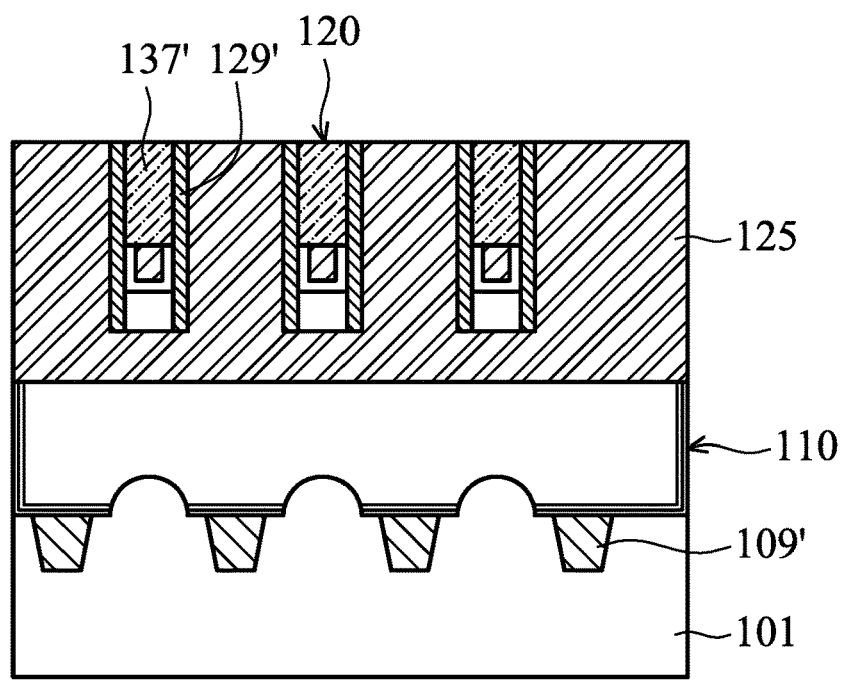
Figure 4O:
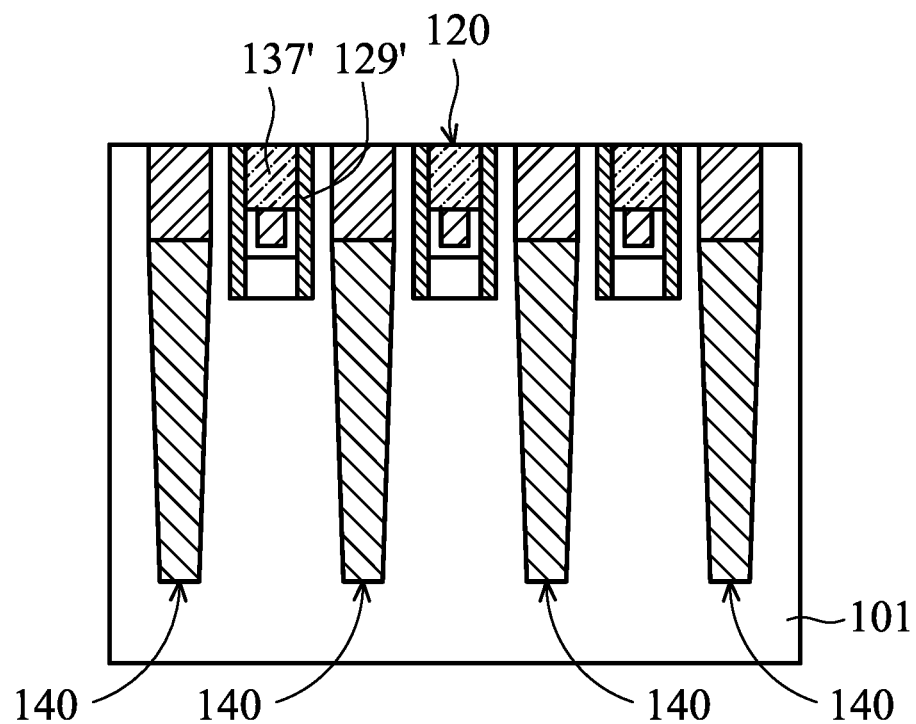

At the same time, referring to FIGS. 4N and 4O, in which FIG. 4N shows a cross section of the dielectric cap layer 137' and the spacer 129' located directly above the word line 110 after the etch back process is performed on the dielectric material 137, and FIG. 4O shows a cross section of the dielectric cap layer 137' and the spacer 129' located between two adjacent word lines 110 after the etch back process is performed on the dielectric material 137. As shown in FIG. 4N, along line B-B of FIG. 1, the bit line 120 located directly above the word line 110 has a top surface that is coplanar with the top surface of the dielectric material 125. As shown in FIG. 4O, along line C-C of FIG. 1, the bit line 120 located between two adjacent word lines 110 has a top surface that is coplanar with the top surface of the semiconductor substrate 101 and the top surface of the isolation structure 140.

Figure 5A:
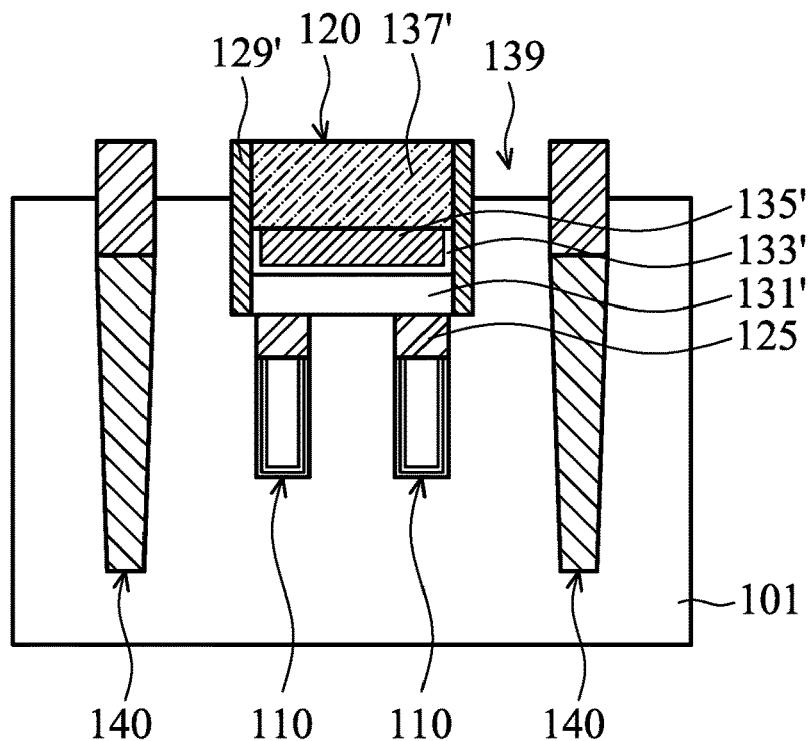

Following FIG. 4M, referring to FIGS. 5A to 5E, cross sections of various intermediate stages of the method of fabricating the memory device 100 according to some embodiments are shown. FIGS. 5A to 5E are taken along line A-A of FIG. 1. As shown in FIG. 5A, the oxide layer 103 is removed to form a recess 139 between the isolation structure 140 and the bit line 120. In some embodiments, the oxide layer 103 is completely removed. The recess 139 has a depth that is substantially equal to the thickness T1 of the oxide layer 103 (as shown in FIG. 2A), for example about 50 nm. In some other embodiments, the oxide layer 103 is partially removed. In some embodiments, the oxide layer 103 is removed by a wet etching process. Because the material of the spacer 129' and the material of the second dielectric portion 113' of the isolation structure 140 are different from the material of the oxide layer 103, the wet etching process for removing the oxide layer 103 does not damage the spacer 129' of the bit line 120 and the second dielectric portion 113' of the isolation structure 140. Therefore, the thickness of the spacer 129' of the bit line 120 and the width of the second dielectric portion 113' of the isolation structure 140 remain without change.

Figure 5B:
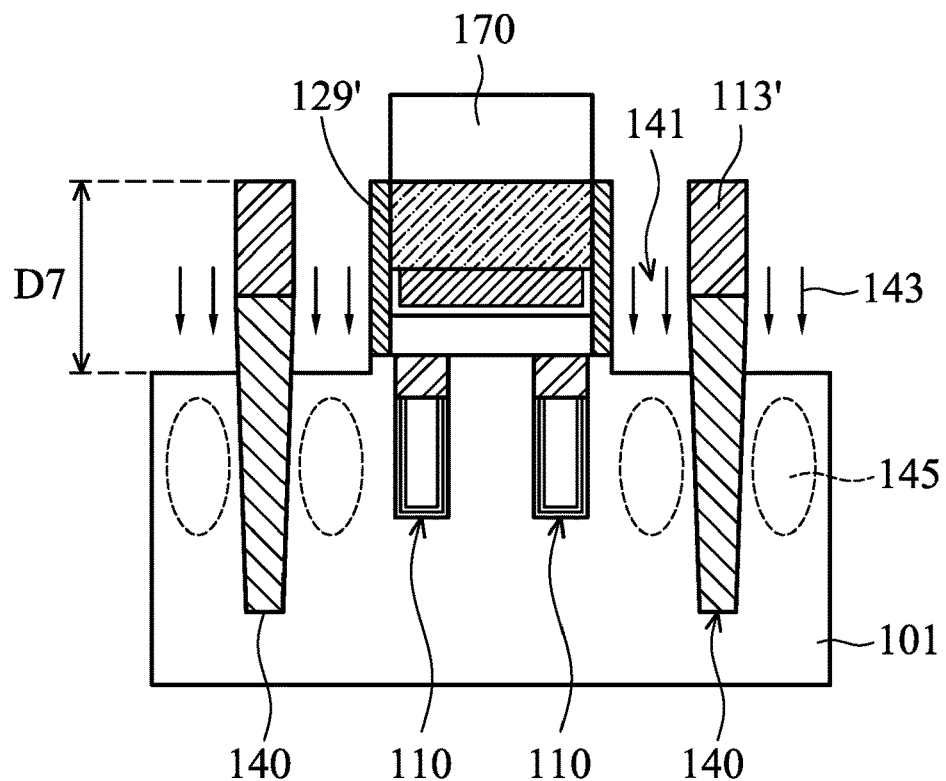

Referring to FIG. 5B, in some embodiments, the semiconductor substrate 101 is etched further through the recess 139 of FIG. 5A to produce a deeper recess 141 than the recess 139. Because the silicon-based material of the semiconductor substrate 101 has a high etch selectivity than the silicon nitride material of the spacer 129' and the silicon nitride material of the second dielectric portion 113' of the isolation structure 140 during the etching process, the etching of the semiconductor substrate 101 can be accurately controlled. Therefore, the etching of the semiconductor substrate 101 does not affect the thickness of the spacer 129' of the bit line 120 and the width of the second dielectric portion 113' of the isolation structure 140.

In some examples, under the top surface of the isolation structure 140, the recess 141 has a depth D7 of about 100 nm. Moreover, before etching the semiconductor substrate 101 through the recess 139, referring to FIG. 1 at the same time, from a top view, a mask 170 is formed to cover a portion of the active area 130. The portion of the active area 130 is outside of the location of the storage node contact 150. The opening of the mask 170 corresponds to the location of the storage node contact 150. The mask 170 is disposed outside of a portion of the active area 130 that corresponds to the storage node contact 150. In some embodiments, the mask 170 is a patterned photoresist that is formed between two adjacent word lines 110. The mask 170 covers a portion of the active area 130 located between the two adjacent word lines 110. Moreover, the mask 170 is also disposed above the bit line 120. After the recess 141 is formed, the mask 170 is removed. Next, an ion implantation process 143 is performed on the semiconductor substrate 101 through the recess 141 to form a lightly doped drain (LDD) region 145.

Figure 5C:
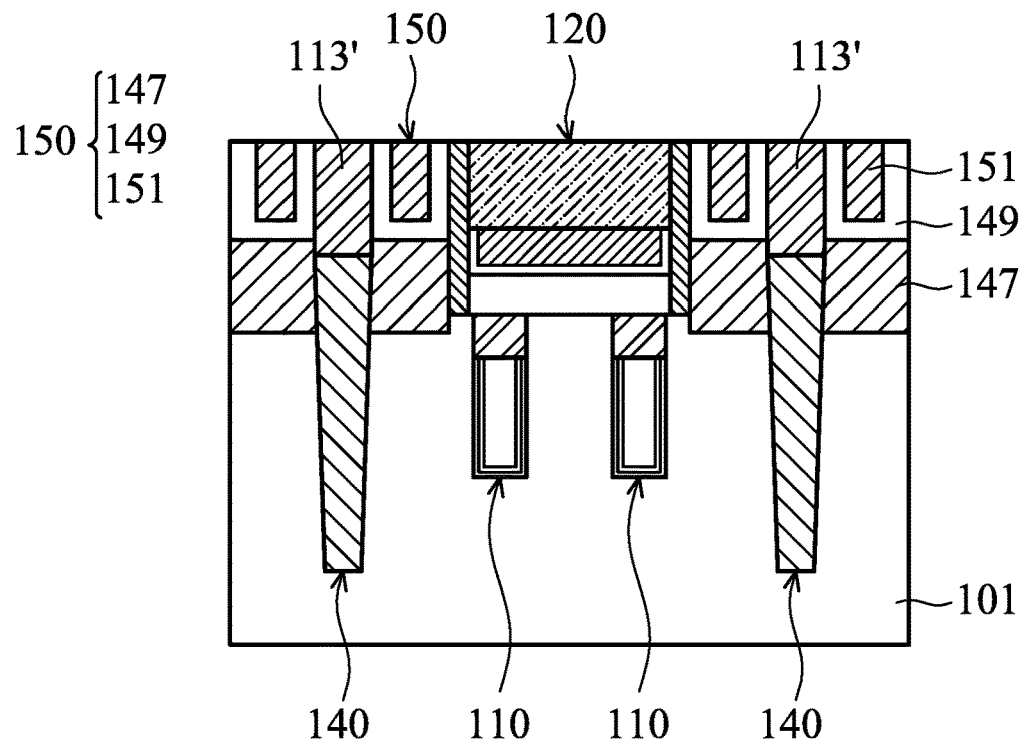

Referring to FIG. 5C, a first conductive material layer is first deposited in the recess 141. In some embodiments, the first conductive material layer is for example a doped polysilicon layer. An etch-back process is performed on the first conductive material layer to form a first conductive portion 147 of the storage node contact 150 in the recess 141. The first conductive portion 147 does not fully fill the recess 141. Next, a barrier material layer and a second conductive material layer are deposited on the first conductive portion 147 in sequence to fully fill the recess 141. Moreover, the barrier material layer and the second conductive material layer are also deposited on the region outside of the recess 141. In some embodiments, the barrier material layer is for example titanium nitride (TiN), and the second conductive material layer is for example tungsten (W). Then, the deposited barrier material layer and the deposited second conductive material layer are etched back to form a barrier layer 149 and a second conductive portion 151 of the storage node contact 150 in the recess 141.

As shown in FIG. 5C, in some embodiments, the storage node contact 150 includes the first conductive portion 147, the barrier layer 149 and the second conductive portion 151. The second conductive portion 151 is disposed over the first conductive portion 147. The barrier layer 149 is disposed between the first conductive portion 147 and the second conductive portion 151, and the barrier layer 149 surrounds the second conductive portion 151. According to embodiments of the disclosure, the top surface of the storage node contact 150 is coplanar with the top surface of the isolation structure 140. Moreover, the top surface of the storage node contact 150 is also coplanar with the top surface of the bit line 120.

Figure 5D:
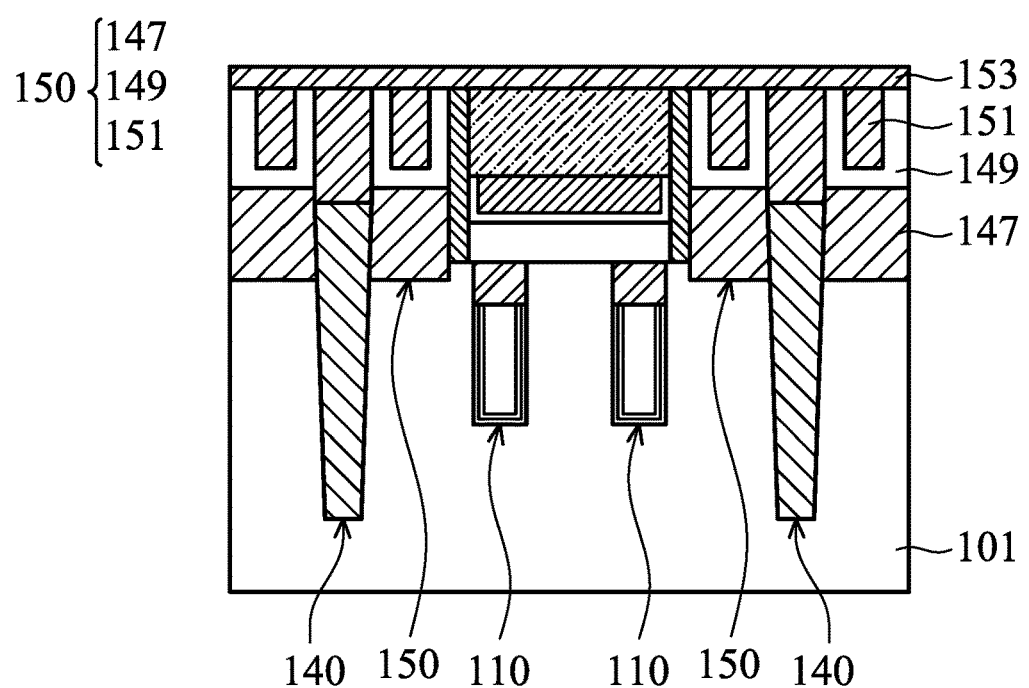

Referring to FIG. 5D, a dielectric liner layer 153 is formed on the structure of FIG. 5C. In some embodiments, the material of the dielectric liner layer 153 is for example silicon nitride. The dielectric liner layer 153 covers the storage node contact 150, the bit line 120 and the isolation structure 140.

Figure 5E:
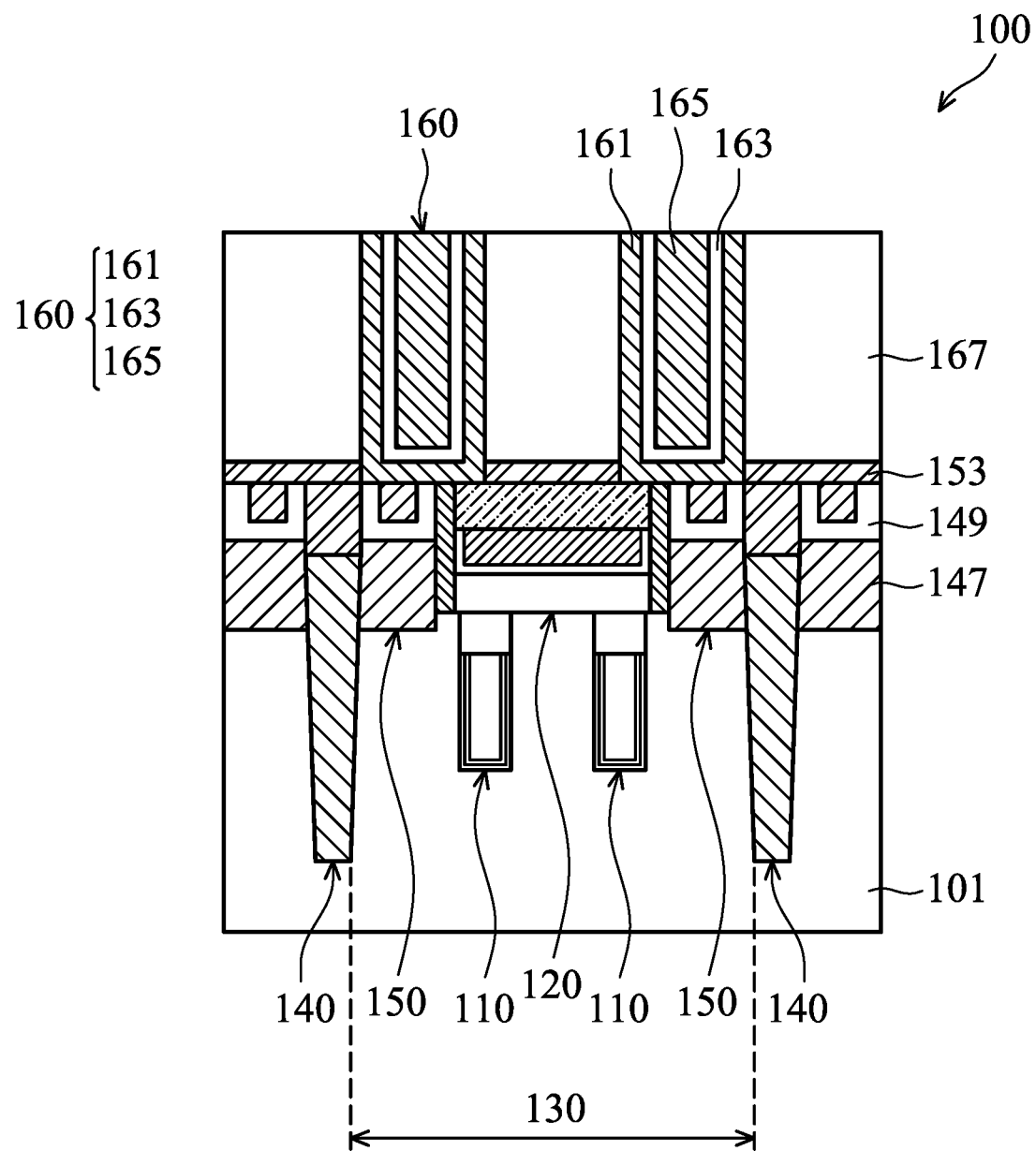

Referring to FIG. 5E, a capacitor 160 is formed on the structure of FIG. 5D. The capacitor 160 passes through the dielectric liner layer 153 to electrically connect with the storage node contact 150. First, an interlayer dielectric (ILD) layer 167 is formed on the dielectric liner layer 153. In some embodiments, the material of the ILD layer 167 is for example silicon dioxide. Next, an opening for the capacitor 160 is formed in the ILD layer 167 and the dielectric liner layer 153. The opening may be formed by forming a patterned photoresist or a hard mask on the ILD layer 167 to be used as an etching mask. The etching mask has an opening corresponding to the location of the capacitor 160. Then, an etching process is performed on the ILD layer 167 and the dielectric liner layer 153 to form the opening for the capacitor 160. Thereafter, the materials of a first electrode 161, a dielectric layer 163 and a second electrode 165 are deposited in sequence in the opening for the capacitor 160 and on the ILD layer 167. Then, a planarization process is performed on the above-mentioned deposited materials to make the top surface of the capacitor 160 be coplanar with the top surface of the ILD layer 167. As a result, the memory device 100 shown in FIG. 5E is completed.

Figure 6A:
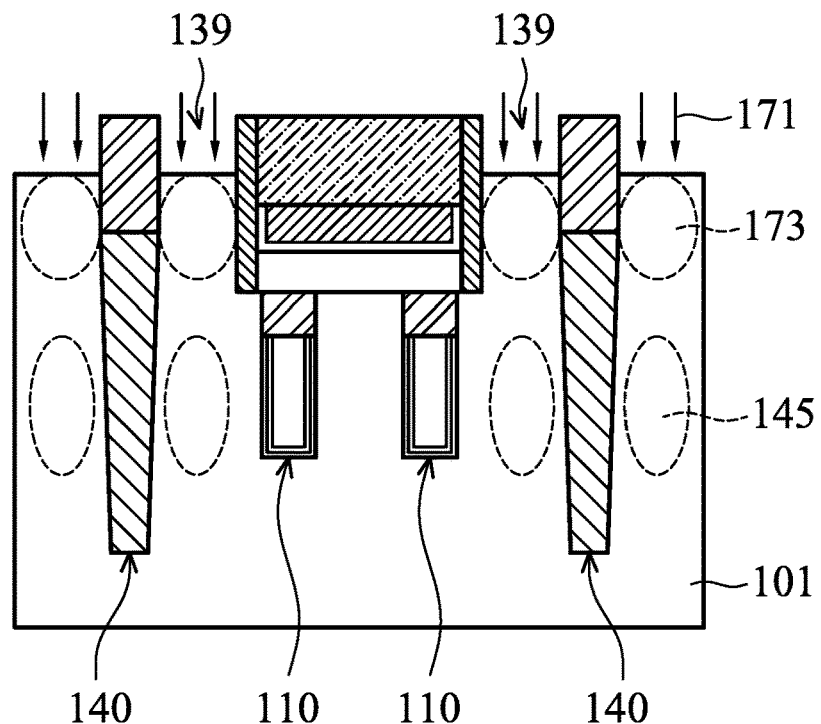
FIGS. 6A and 6B show schematic cross sections of various intermediate stages of a method of fabricating a memory device according to some other embodiments, which are taken along line A-A of FIG. 1.
Figure 6B:
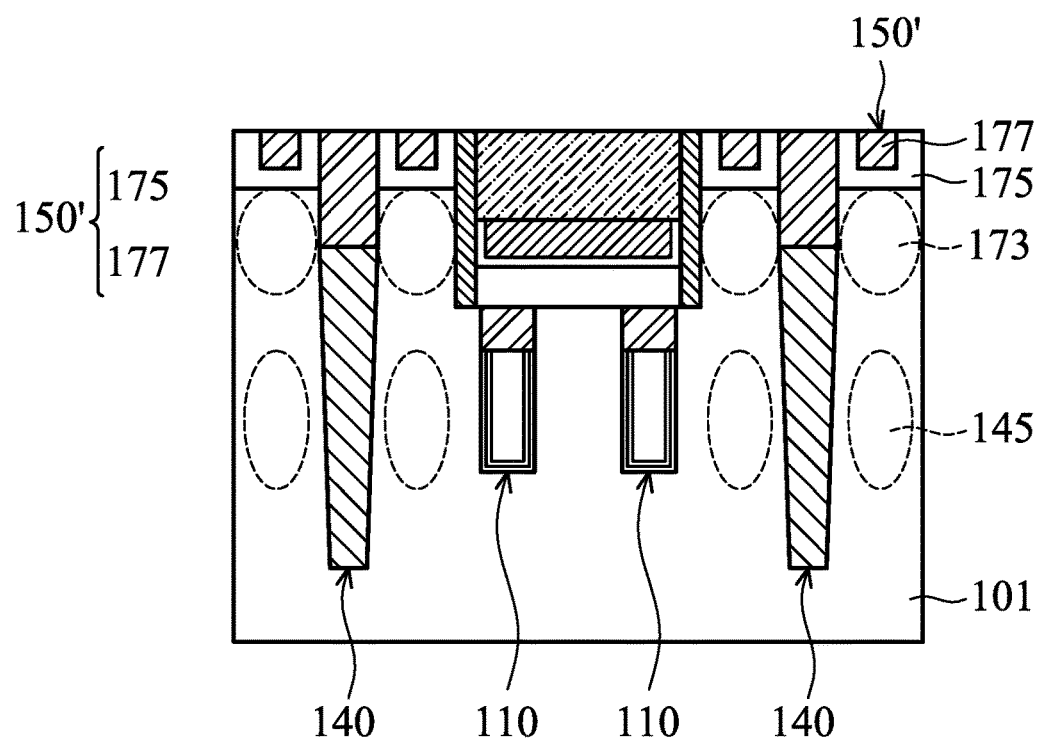

FIGS. 6A and 6B show cross sections of various intermediate stages of a method of fabricating a memory device according to some other embodiments. FIGS. 6A and 6B are taken along line A-A of FIG. 1. Following the structure of FIG. 5A and referring to FIG. 6A, after the oxide layer 103 is removed to form a recess 139, the semiconductor substrate 101 is not etched any further. An ion implantation process is performed first on the semiconductor substrate 101 through the recess 139 to form a lightly doped drain (LDD) region 145. Thereafter, another ion implantation process 171 is performed on the semiconductor substrate 101 through the recess 139 to form a doped region 173 above the LDD region 145.

Referring to FIG. 6B, a barrier material layer and a conductive material layer are deposited in sequence in the recess 139 of FIG. 6A to fully fill the recess 139. Moreover, the barrier material layer and the conductive material layer are also deposited on the region outside of the recess 139. In some embodiments, the barrier material layer is for example titanium nitride (TiN), and the conductive material layer is for example tungsten (W). Next, the barrier material layer and the conductive material layer are etched back to form a barrier layer 175 and a conductive portion 177 in the recess 139. In the embodiment, a storage node contact 150' includes the barrier layer 175 and the conductive portion 177. The barrier layer 175 surrounds the sidewalls and the bottom of the conductive portion 177. In addition, the doped region 173 is disposed below and adjacent to the storage node contact 150'. In the embodiment, the doped region 173 can provide a function that is similar to that of the first conductive portion 147 of the storage node contact 150 in FIG. 5C. The steps of the fabrication process like those described with reference to FIGS. 5D and 5E are performed on the structure of FIG. 6B to form the capacitor 160 and complete the memory device.

According to embodiments of the disclosure, the storage node contact is formed in the recess which is formed by removing the oxide layer located in the active area of the memory device. Therefore, the formation of the storage node contact uses a self-alignment process, which does not require an additional mask to form the storage node contact of the memory device. Since the formation of the storage node contact can be completed without an additional mask, the fabrication of the memory device can omit one photomask process. Therefore, the steps of the process of fabricating the memory device are thereby simplified.

Moreover, from a top view, the storage node contact can be completely located in the area of the active area. In some embodiments, there is no shift (or zero-shift) in the overlapping between the storage node contact and the active area. The boundary of the storage node contact can be aligned with the boundary of the active area. For memory devices with a continuous reduction in scale and a gradual increased in integrated density, the embodiments of the disclosure can reduce the contact resistance between the storage node contact and the active area. Furthermore, the performance and reliability of these memory devices are thereby enhanced.

In addition, according to embodiments of the disclosure, the bit line is formed in the trench within the semiconductor substrate. The top surface of the bit line, the top surface of the storage node contact, and the top surface of the isolation structure are coplanar. The bit line is buried in the semiconductor substrate. Accordingly, the bit line will not have a probability of collapsing, and the reliability of the memory devices is thereby enhanced.

Furthermore, according to embodiments of the disclosure, due to the etch selectivity of the materials of various element layers, in the process of removing the oxide layer located in the active area to form the recess for the storage node contact, and in the process of further etching the semiconductor substrate to deepen the recess for the storage node contact, there is no material loss in the upper second dielectric portion of the isolation structure. Accordingly, the width of the isolation structure remains the same. Therefore, there is no risk of electrical short between the unit cells of the memory device. Moreover, there is no material loss in the spacer between the conductive portion of the bit line and the storage node contact. Accordingly, the thickness of the spacer remains without change. Therefore, there is no parasitic capacitance problem between the bit line and the storage node contact.

In addition, according to some embodiments of the disclosure, the upper second dielectric portion of the isolation structure may be made of silicon nitride. The upper second dielectric portion covers the lower first dielectric portion of the isolation structure which is made of silicon oxide. Accordingly, there is no material loss of the isolation structure during the subsequent steps of the process. Therefore, the embodiments of the disclosure can avoid electrical short occurring between adjacent unit cells of the memory device. The yield and the reliability of the memory devices are thereby enhanced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A memory device, comprising:
a semiconductor substrate having an isolation structure disposed therein to define an active area;
a word line and a bit line disposed in the semiconductor substrate, wherein the bit line is disposed above the word line; and
a storage node contact disposed between the isolation structure and the bit line, wherein from a top view, the storage node contact overlaps a corresponding portion of the active area, and the storage node contact has a top surface that is coplanar with the top surface of the isolation structure.

2. The memory device as claimed in claim 1, wherein from the top view, the storage node contact has an area that is equal to the area of the corresponding portion of the active area.

3. The memory device as claimed in claim 1, wherein the bit line comprises a conductive portion and a dielectric cap layer disposed on the conductive portion, the dielectric cap layer comprises silicon nitride, and the storage node contact has a top surface that is coplanar with the top surface of the bit line.

4. The memory device as claimed in claim 3, wherein the bit line further comprises a spacer layer disposed on sidewalls of the conductive portion and the dielectric cap layer, the spacer layer comprises silicon nitride, and the spacer layer is located between the storage node contact and the conductive portion of the bit line.

5. The memory device as claimed in claim 1, wherein the isolation structure comprises a first dielectric portion and a second dielectric portion above the first dielectric portion, the first dielectric portion comprises silicon oxide, and the second dielectric portion comprises silicon nitride.

6. The memory device as claimed in claim 1, wherein the storage node contact is disposed in the semiconductor substrate, the storage node contact comprises a first conductive portion and a second conductive portion above the first conductive portion, the first conductive portion comprises polysilicon, and the second conductive portion comprises metal.

7. The memory device as claimed in claim 1, further comprising a doped region disposed under the storage node contact, wherein the storage node contact comprises a conductive portion and a barrier layer surrounding the conductive portion, and the conductive portion comprises metal.

8. The memory device as claimed in claim 1, further comprising a capacitor disposed on the storage node contact, wherein the capacitor is electrically connected to the storage node contact.

* * * * *